(12) United States Patent
Brox

(10) Patent No.: US 7,053,655 B2
(45) Date of Patent: May 30, 2006

(54) MULTI-LEVEL DRIVER STAGE

(75) Inventor: Martin Brox, München (DE)

(73) Assignee: Infineon Technologies AG, Munich (DE)

( * ) Notice: Subject to any disclaimer, the term of this patent is extended or adjusted under 35 U.S.C. 154(b) by 112 days.

(21) Appl. No.: 10/690,001

(22) Filed: Oct. 21, 2003

(65) Prior Publication Data

US 2004/0085091 A1 May 6, 2004

(30) Foreign Application Priority Data

Oct. 21, 2002 (DE) .................... 102 49 016

(51) Int. Cl.
*H03K 19/02* (2006.01)
(52) U.S. Cl. ............... 326/60; 326/59; 375/286
(58) Field of Classification Search ........... 326/59–60; 375/286–288

See application file for complete search history.

(56) References Cited

U.S. PATENT DOCUMENTS 6,140,841 A * 10/2000 Suh .................. 326/60
6,292,014 B1 9/2001 Hedberg .............. 326/30
6,339,622 B1 * 1/2002 Kim ................... 375/287

FOREIGN PATENT DOCUMENTS

DE 198 25 258 A1 12/1999

OTHER PUBLICATIONS

Author not listed: "EIA/JEDEC Standard; Stub Series Terminated Logic for 3.3 Volts (SSTL_3)", Electronic Industries Association, Engineering Department, No. 8-8, Aug. 1996, pp. 1-14.

* cited by examiner

*Primary Examiner*—James H. Cho
(74) *Attorney, Agent, or Firm*—Laurence A. Greenberg; Werner H. Stemer; Ralph E. Locher

(57) ABSTRACT

An inventive driver stage for driving an output on one of n-levels, which are each spaced from each other by a voltage difference of $\Delta V$, includes a plurality of field effect transistors for driving the output by supplying or removing a current to or from the output, with the relationship of the channel widths of at least two field effect transistors, which both function either to lead a current to or away, being set in dependence on the value of the voltage difference.

6 Claims, 1 Drawing Sheet

MULTI-LEVEL DRIVER STAGE

BACKGROUND OF THE INVENTION

1. Field of the Invention

The present invention relates to driver stages for driving an output on one of n-levels, as may be used for example in multi-level signaling.

2. Description of the Prior Art

Multi-level signaling enjoys a growing interest with respect to bus interfaces having a high bandwidth. Multi-level signaling techniques, in which two bits are simultaneously transmitted to a clock cycle and/or a clock edge, currently take a different stand. In order to achieve this, the bus is driven to one of four different levels, which may then be decoded on the receiver-side by a simple two-bit analog/digital conversion.

The U.S. Pat. No. 6,140,841 describes a high-speed interface device comprising a data driver means for decoding 2-bit data signals so as to obtain 4-level data signals, a reference voltage generation means for generating multi-level reference voltages so as to be able to differentiate between the voltage levels of the 4-level data signals, and a receiving means for simultaneously comparing the 4-level data signals with multi-level reference voltage signals, so as to output 2-bit data signals, depending on the comparison. An example of a data driver means includes three n-channel MOS-transistors connected in parallel between ground and the transmission line, which is biased via terminal resistors on a terminal voltage. The channel widths of the transistors are 2WN each. By turning the respective transistors on and off, the total channel width is changed step-wise by 2WN, as a result of which the driving current and the driving voltage on the transmission line are equidistantly changed on a step-wise basis. Each of the resulting four possible voltage values and/or voltage levels is associated with a combination of bit values of the 2-bit data signals. The reference voltages will be set to the voltages which are located in the center between the possible four voltage levels. A further example for the data driver means provides two p-channel MOS-transistors connected in parallel between the supply voltage and the transmission line and two n-channel MOS-transistors connected between ground and the transmission line. The transistor width of one of the pairs of transistors each is two times the size of the one of the other one of the respective pairs of transistors. By turning the transistors on and off, four different voltage levels are generated which are arranged equidistantly to each other by a voltage difference.

A disadvantage of the high-speed interface device of the U.S. Pat. No. 6,140,841 is that when using this device, either serious transmission errors occur or complex adjustments of the reference voltages are necessary, so as to avoid these transmission errors.

SUMMARY OF THE INVENTION

It is the object of the present invention to provide a driver stage for driving an output on one of n-levels as wells as a manufacturing method for the same so that, when using the same, less errors occur on the receiver-side for multi-level transmission.

In accordance with a first aspect of the invention this object is achieved by an inventive driver stage for driving an output on one of n-levels which are each spaced from each other by a voltage difference of ΔV, includes a plurality of field effect transistors for driving the output by leading a current to or away from the output, with the ratio of the channel widths of at least two field effect transistors, which are both acting either for supplying or removing a current, being adjusted depending on the value of the voltage difference.

In accordance with a second aspect of the invention, this object is achieved by a method for manufacturing a driver stage for driving an output on one of n-levels, which are each spaced from each other by a voltage difference of ΔV, comprising the following steps:

forming a plurality of field effect transistors for driving the output by supplying or removing current to or from the output, with the relationship of the channel width of at least two field effect transistors, which both function to either lead current to or away, being set in dependence on the value of the voltage difference The recognition of the present invention consist in that the simple scaling of the channel widths, such that the ratio of the channel widths of the respectively activated push-transistors, i. e. the respective current-supplying field effect transistors, or the respective activated pull-transistors, i.e. the respective current-removing field effect transistors, equals the ratio of the desired voltage level changes, results in errors when decoding on the receiver-side and/or in analog/digital conversion, and that instead, the ratio of the channel widths below the pull- and/or push-field effect transistors is to be adjusted depending on the desired value of the voltage difference between the desired n-output levels.

BRIEF DESCRIPTION OF THE DRAWINGS

Preferred embodiments of the present invention will be explained in detail below with reference to the attached drawings in which.

DETAILED DESCRIPTION OF THE PREFERRED EMBODIMENTS

In the following, an embodiment for a driver stage will be described with reference to FIGS. 1 and 2, which may be used as a multi-level transmission interface. However, other applications are also conceivable. It is realized in MOS-technology and suited for a voltage mode driver operation and does not have to use a voltage mode driver operation. This is advantageous in that the current mode driver operation has gained great currency by the DDR-SDRAM-SSTL interface specification (DDR=double data rate; SDRAM=synchronous dynamic random access memory; SSTL=stub series terminated logic). However, the invention is not limited to the application in this interface specification. In particular, the following description relates to a four-level driver stage, with the invention, however, being also applicable to other multi-level methods with n>2.

Figure 1:
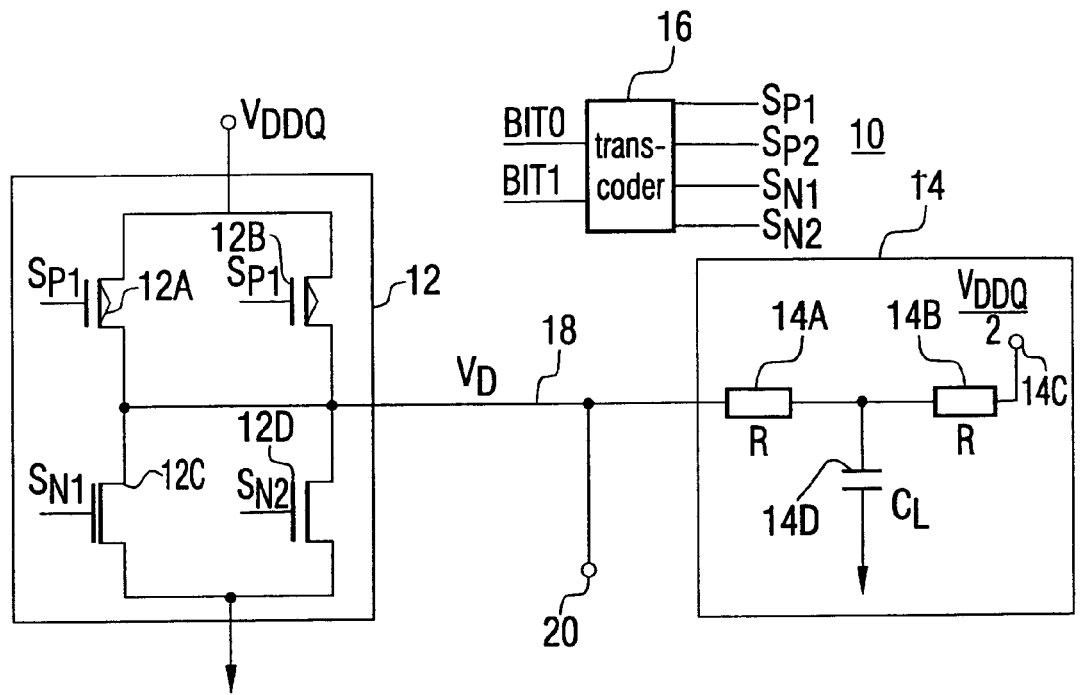
FIG. 1 shows a circuit diagram of a driver stage in accordance with an embodiment of the present invention.

The driver stage from FIG. 1 being generally indicated at 10, is essentially divided up into three parts, that is a push/pull circuit part 12 and a transcoder 16. Additionally shown is the external line terminal circuit part 14. The push/pull circuit part 12 includes four field effect transistors, i. e. two pMOS-transistors 12a and 12b and two nMOS-transistors 12c and 12d. With their drain/source path, the pMOS-transistors 12a and 12b are connected in parallel between a supply voltage $V_{DDQ}$ and the transmission line, on which the driver stage 10 is to generate one of four voltage levels, with the transmission line being indicated at 18 in FIG. 1. The nMOS-transistors 12c and 12d are similarly connected in parallel to each other with their source/drain paths between ground and the transmission line 18.

The gate terminals of the transistors 12a–12d are controlled by signals $S_{P1}$, $S_{P2}$, $S_{N1}$ and $S_{N2}$, which receive the same from the transcoder 16 which, in turn, sets the same in accordance with a unique activation scheme and/or a unique allocation rule depending on the bit values of two incoming bit signals, i. e. bit 0 and bit 1. These bits represent the information to be transmitted, i. e. one of four conditions and/or voltage levels, which are to be transmitted in a clock cycle and/or at a clock edge.

The external transmission line terminal circuit part 14 includes two terminal resistors 14a and 14b, which are connected in series between the free end of the transmission line 18, which is not connected to the transistors 12a to 12b of the push/pull circuit part 12, and a transmission line termination bias voltage terminal 14c, to which the terminal voltage $V_{tt}$ is applied, so as to bias the transmission line 18 via the resistors 14a and 14b to the terminal voltage $V_{tt}$. Presently, as an example, the terminal voltage $V_{tt}$ is half of the supply voltage $V_{DDQ}$. Both resistors 14a and 14b comprise a resistance of for example 25 Ohm. Further, the transmission line terminal circuit part 14 includes a capacitive load 14d typically occurring between both resistors 14a and 14b. The capacitive load 14d comprises a capacity $C_L$, which, for example, is 30 fF.

The output, where the driver stage 10 is to generate one of four predetermined voltage levels and where receiving circuits (not shown) are to be connected for an analog/digital conversion, is indicated at 20 in FIG. 1, and is connected to a transmission line 18 at a point between the push/pull circuit part 12 and the transmission line terminal circuit part 14.

After having previously described the structure of the driver stage 10, the functionality of the same and/or its desired functionality will be described below with detailed reference being made to the setting of the channel widths of the transistors 12a–12d, which is necessary so as to enable the driver stage 10 to fulfill certain desired criteria, such as for example the desired voltage difference between the four output voltage levels.

Via the transmission line termination terminal 14c, with the transistors 12a–12d being turned off and/or switched to a non-conducting state, the transmission line 18 is biased to the terminal voltage $V_{tt}=V_{DDQ}/2$. The transmission line 18 from FIG. 1 thus corresponds to a standard SSTL bus with a terminal at $V_{tt}$. By turning a predetermined selection of transistors 12a–12d on and off, current is passed from the transmission line 18 to ground and/or from the supply voltage $V_{DDQ}$, as a result of which the voltage $V_D$ on the transmission line 18, which simultaneously represents the drain voltage at the transistors 12a–12d, is decreased or increased. To put it more precisely, supplying or removing a current causes a voltage drop across both resistors 14a and 14b, as a result of which a voltage level between $V_{DDQ}$ and $V_{tt}$ is generated at the output 20 and/or the transmission line 18 when current is supplied, and a voltage is generated between ground and $V_{tt}$ when current is led away.

In the present embodiment, in order to provide a possibly simple receiver-side decoding of the 4-level signal generated by the driver stage 10, the four voltage levels are to be arranged equidistantly between ground and $V_{DDQ}$. The desired voltage value in accordance with the present embodiment for a voltage difference $\Delta V$, which is still to be specified, is shown in FIG. 2a.

Figure 2A:
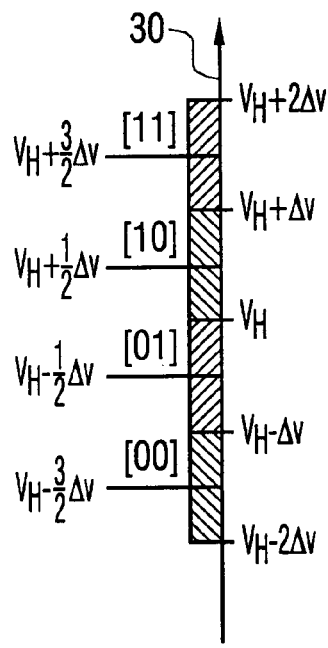
FIG. 2a–2c show desired voltage levels plotted along a voltage axis as well as pertaining validity areas for the case of a freely selectable voltage difference, the voltage difference of a quarter of the supply voltage and/or of a voltage difference of one third of the supply voltage.

FIG. 2a shows the desired voltage levels, with virtual units plotted via a voltage axis 30 on the left side of the axis 30. As may be seen, the desired voltage levels are symmetrically arranged to the terminal voltage $V_{tt}$. In addition, each desired voltage level is associated with one of the possible four combinations of input bits, i. e. 00, 01, 10 and 11, as is indicated in square brackets.

Further, a hatched validity area is shown in FIG. 2a for each of the four desired voltage levels, with hatched areas to the left of axis 30. Each desired voltage level is associated with a validity area and is arranged in the center within the same. The validity areas abut each other and thus form a continuous voltage area without any gaps. Depending on the validity area, in which the voltage level falls at the output 20 of the driver stage 10, the received signal level on the receiver side will be associated with the corresponding bit combination to be transmitted. This is performed by comparing the voltage applied to output 20 with reference voltages, which are indicated on the right-hand side of the axis 30 and which represent the limiting values of the abutting limiting areas, which separate two adjacent validity areas from each other, i.e. $V_{tt}+\Delta V$, $V_{tt}$ and $V_{tt}-\Delta V$. Further details with respect to receiving and decoding the generated 4-level voltage signal may be taken from U.S. Pat. No. 6,140,841, which is incorporated herein by reference.

On the basis of the limitation by the supply voltage $V_{DDQ}$ it becomes clear that the voltage difference $\Delta V$ is restricted to voltage levels less than $V_{DDQ}/2$, since otherwise two of the four validity areas fall outside the possible voltage values, i. e. the validity areas of the bit combinations 11 and 00. In table 1, for each possible bit combination of the input bit signals (first column), the values for the desired and/or target voltage on the transmission line 18 (central column) and the pertaining validity area (right column) are indicated in dependence on the desired signal difference between the desired signal levels.

TABLE 1

| Bit combination | Desired voltage level | Validity area |
| --- | --- | --- |
| 00 | $V_{tt} - 3/2\,\Delta V$ | $[0; V_{tt} - \Delta V]$ |
| 01 | $V_{tt} - 1/2\,\Delta V$ | $[V_{tt} - \Delta V; V_{tt}]$ |
| 10 | $V_{tt} + 1/2\,\Delta V$ | $[V_{tt}; V_{tt} + \Delta V]$ |
| 11 | $V_{tt} + 3/2\,\Delta V$ | $[V_{tt} + \Delta V; V_{DDQ}]$ |

Figure 2B:
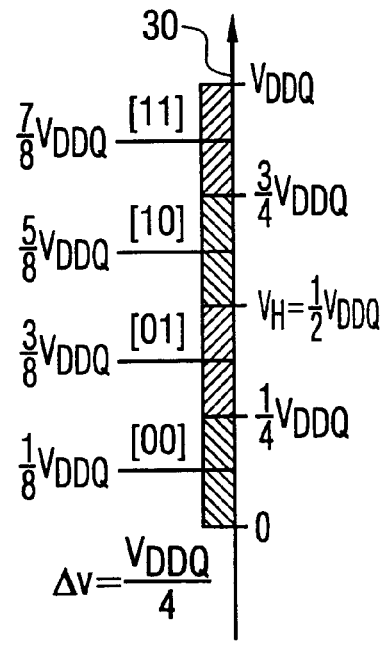
Figure 2C:
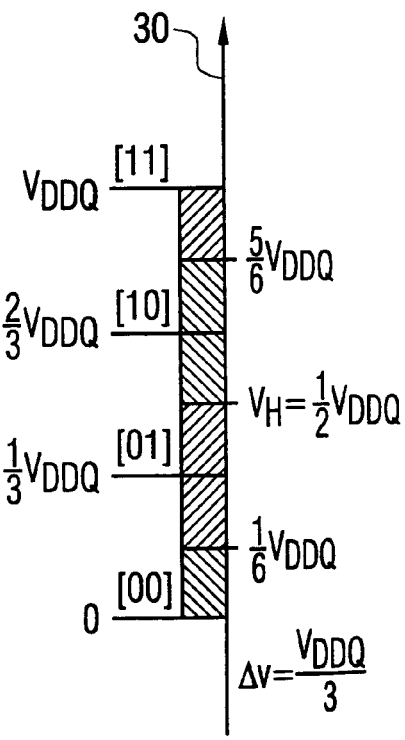

In FIGS. 2b and 2c, two explicit plots for desired voltage levels and pertaining validity areas are shown, which are a result of the representation of FIG. 2a by setting $\Delta V$ to $V_{DDQ}/4$ and/or to $V_{DDQ}/3$. The numbers in square brackets refer to the bit combinations with which the respective desired voltage level and/or the validity area, which are associated with the same, are associated.

As has been previously described, the desired voltage levels shown in FIG. 2a–2c are achieved by turning a certain selection of transistors 12a–12d on and off, so as to lead a current to or away from input 20, as a result of which the voltage at output 20 is pulled up and/or down. Selecting and/or activating the transistors 12a–12d is taken over by the transcoder 16 converting the input bit signals in accordance with the activation scheme and/or the mapping rule shown in the same in table 2 below into a different set of driving signals $S_{P1}$, $S_{P2}$, $S_{N1}$, $S_{N2}$, such that different transistors 12a–12d are turned on and off, respectively.

TABLE 2

| Bit combination | $S_{N1}$ | $S_{N2}$ | $S_{P1}$ | $S_{P2}$ |
|---|---|---|---|---|
| 00 | $V_{DDQ}$ | $V_{DDQ}$ | $V_{DDQ}$ | $V_{DDQ}$ |
| 01 | $V_{DDQ}$ | 0V | $V_{DDQ}$ | $V_{DDQ}$ |
| 10 | 0V | 0V | 0V | $V_{DDQ}$ |
| 11 | 0V | 0V | 0V | 0V |

As may be seen from table 2, in the case of an incoming bit combination of 00, which corresponds to the lowest desired voltage level in accordance with FIG. 2a, the transcoder 16 activates both full transistors 12c and 12d and deactivates the push-transistors 12a and 12b by selecting the gates of the first-mentioned with $V_{DDQ}$ and the gates of the last-mentioned with $V_{DDQ}$. Because of this the transistors 12a and 12b are disabled. The transistors 12c and 12d lead current to ground, as a result of which the voltage drop across the resistors 14a and 14b causes a reduction of the voltage at output 20. With a bit combination of 01, only transistor $N_{N1}$ will now be activated. Consequently, less current is led away, as a result of which the voltage drop across the resistors 14a and 14b, and thus the voltage reduction at output 20, is lower.

Conversely, in the case of bit combination 11, the transcoder 16 activates both push-transistors 12a and 12b and deactivates the two pull-transistors 12c and 12d. The current supply by the bit transistors 12a and 12b causes a voltage increase across the resistors 14a and 14b in contrast to the terminal voltage $V_{tt}$ at the output 20. In the case of the incoming bit combination 10, the transcoder 16 activates only one of the pull-transistors 12a, resulting in a reduced current supply and a reduced voltage increase at the output 20.

In order to obtain the desired output signal levels as specified by table 1 by way of the activation scheme implemented in transcoder 16, the MOS device characteristics will be considered. Since the resistance values of the resistors 14a and 14b are fixed, the setting of the channel widths setting of the transistors 12a to 12d will be effected such that the current strength, which is achieved by activating the same, will take on suitable values for supplying and/or removing. This will be illustrated in an analytical manner below using the example of the NMOS-transistors 12c and 12d. Only if the ratio of the leakance currents between the activation of both transistors 12c and 12d and the activation only of transistor 12c is 3:1, and if the same correspondingly applies for the transistors 12a and 12d, such a voltage level arrangement in accordance with FIG. 2a may result.

In the case that the nMOS-transistors 12c and 12b operate in the linear range, the setting of the channel widths is not directly proportional to the current contribution of the respective transistor, such that the setting of the channel widths of the same to a ratio of 1:2=WN1:WN2 with WN1 as channel width of the transistor 12c and WN2 as the channel width of the transistor 12c does not result in the desired result, as is shown in FIG. 2a-2c, i. e. the equidistant spacing of the four signal levels. Resulting deviations from this may result in serious transmission errors on the receiver side, which, however, is avoided in accordance with the invention.

Using the example of the nMOS-transistors 12c and 12d, the setting of the channel widths of the same will be described below in dependence on the desired voltage difference ΔV for the case when both are operated in the linear range, the voltage supply $V_{DDQ}$ is 2.5 Volts and the terminal voltage $V_{tt}$ is 1.25 Volts. The threshold voltage $V_{th}$ of the transistors 12c and 12d is assumed to be 0.5 Volts.

Since for calculating the transistor widths only the activation conditions of the bit combinations 00 and 01 are relevant, in which the pMOS-transistors 12a and 12b are turned off, the drain voltage $V_D$ across the activated nMOS-transistor (in case of the input bit combination 01) and/or the activated nMOS-transistors (in the case of the input bit combination 01) is in each case less than the terminal voltage $V_{tt}$, i. e. $V_D<V_{tt}$. The gate voltage $V_G$ of the activated nMOS-transistors, as may be seen from table 2, is 2.5 Volt, i. e. $V_{DDQ}$. Assuming this it may be checked whether the nMOS-transistors 12c and 12d are operated in the linear range. As everybody knows, this is the case, if $V_G-V_{th}>V_D$. This is confirmed by an examination using the above assumptions. Under the above assumptions the nMOS-transistors 12c and 12d are consequently operated in the linear range.

As may now be seen from FIG. 2a and/or table 1, in the case of the bit combination 00, it is desired that the signal voltage level at the output 20 is reduced by 3/2 of ΔV as against the terminal voltage $V_{tt}$. This voltage reduction must be conditioned by the voltage drop across the resistors 14a and 14b, which results from the current leakage by the activated nMOS-transistors 12c and 12d. Therefore, the current $I_R$ through both resistors 14a and 14b must be $I_R=\{3/2\ \Delta V\}/\{2R\}$. In addition, since it is exclusively conditioned by the transistors 12c and 12d, it equals the current $I_D$ through the transistors 12c and 12d, i.e. $I_R=I_D$. Consequently, in the case of the bit combination 00 and the two activated nMOS-transistors 12c and 12d the following applies:

$$I_D=\{3/2\Delta V\}/\{2R\}=3\Delta V/\{4R\} \qquad \text{Equ. 1}$$

Correspondingly, in the case of the bit combination 01, the voltage drop across the resistors 14a and 14b must be 1/2 ΔV, such that the current $I_D$ through the only activated nMOS-transistor 12c, as is shown in table 2, the following applies:

$$I_D=\{1/2\Delta V\}/\{2R\}=\Delta V/\{4R\} \qquad \text{Equ. 2}$$

As has been found out above, the two nMOS-transistors 12c and 12d are operated in the linear range under the present assumptions. In this case, for the context between drain current $I_D$, drain voltage $V_D$, gate voltage $V_G$ and threshold voltage $V_{th}$, the following known equation applies:

$$I_D=A \cdot W \cdot V_D[V_G-V_{th}-1/2V_D] \qquad \text{Equ. 3}$$

where W designates the transistor width and A is a proportionality constant. In the case of bit combination 00, since both nMOS-transistors 12c and 12d are activated, the sum of the channel widths $W_{N1}$ of the transistor 12c and of the channel width $W_{N2}$ of the transistor 12d is to be inserted for the transistor width W in equation 3, i.e. $W=W_{N1}+W_{N2}$, while, in the case of bit combination 01, since only the nMOS-transistor 12c is activated, only the channel width $W_{N1}$ is to be inserted for the transistor width W, i.e. $W=W_{N1}$. In the last-mentioned case, equation 3 already enables the calculation of a value to be set for $W_{N1}$ for a given voltage difference ΔV.

Inserting the right expression of equation 3 into the equations 1 and 2 for $I_D$ and replacing the channel width W by $W_{N1}+W_{N2}$ in the case of equation 1 and by $W_{N1}$ in the case of equation 2 and dividing the resulting equation 1 by the resulting equation 2 and solving the equation for the relationship $W_{N2}/W_{N1}$ will then result in:

$$\frac{W_{N2}}{W_{N1}} = 3\frac{V_{DDQ} - \Delta V}{V_{DDQ} - 3\Delta V} \frac{3V_{DDQ} - 4V_{th} + \Delta V}{3V_{DDQ} - 4V_{th} + 3\Delta V} - 1 \quad \text{Equ. 4}$$

Similar considerations lead to the result that the relationship between the channel width $W_{P1}$ of the pMOS-transistor 12a and $W_{P2}$ of the pMOS-transistor 12b is to be set in a corresponding manner in dependence on the desired voltage difference $\Delta V$:

$$\frac{W_{P2}}{W_{P1}} = 3\frac{V_{DDQ} - \Delta V}{V_{DDQ} - 3\Delta V} \frac{3V_{DDQ} - 4V_{th} + \Delta V}{3V_{DDQ} - 4V_{th} + 3\Delta V} - 1 \quad \text{Equ. 5}$$

The setting of the channel widths of the transistors 12a–12d is therefore provided in accordance with the equations 4 and 5 and depends on the desired voltage difference $\Delta V$. Table 3 shows the channel width relationship $W_{N2}/W_{N1}$ (mean column) to be se and the channel width relationship $W_{P2}/W_{P1}$ (right column) to be set, for three exemplary voltage differences, with the latter resulting by inserting the corresponding voltage difference $\Delta V$ into equations 4 and 5.

TABLE 3

| $\Delta V$ | $W_{N2}/W_{N1}$ | $W_{P1}/W_{P2}$ |
|---|---|---|
| 0, 1 V | 2, 16 | 2, 16 |
| 0, 2 V | 2, 39 | 2, 39 |
| 0, 4 V | 3, 27 | 3, 27 |

By an analytical consideration or by a consideration obtained via a circuit simulation of, for example, parasitic effects, the equations 4 and 5 may be further improved. In any case, the desired signal level configuration from FIG. 2a may be achieved at least essentially by setting the transistor widths of the transistors 12a–12d to channel width relationships, as established by the equations 4 and 5.

With respect to the preceding description, it should be appreciated that the above is merely an exemplary assumption that, upon activating the nMOS-transistors, the supply voltage $V_{DDQ}$ is used as gate voltage $V_G$, and 0 Volts are used as a gate voltage for activating the pMOS-transistors 12a and/or 12b. Other controlled voltages are also possible. Under this generalization the following results for the channel width relationships to be set:

$$\frac{W_{P2}}{W_{P1}} = \frac{W_{N2}}{W_{N1}} = 3\frac{V_{DDQ} - \Delta V}{V_{DDQ} - 3\Delta V} \frac{4V_G - 4V_{th} - V_{DDQ} + \Delta V}{4V_G - 4V_{th} - V_{DDQ} + 3\Delta V} - 1 \quad \text{Equ. 6}$$

The driver interface described above in exemplary form, is therefore employable as a driver stage in a voltage mode-4-level interface, i. e. a 4-level SSTL driver. Thus, it may also correspond to the DDR-SDRAM-SSTL interface specification. For suitably dimensioning the push- and/or pull-field effect transistors, the dependence on the desired voltage difference between the desired voltage level was considered. In addition, it was also considered that the transistors operate in a linear operation. In contrast to the channel width setting in accordance with the U.S. Pat. No. 6,140,841 described in the introductory part of the description, the relationship is greater 2.

With respect to the previous description, it should be appreciated, that, above, the driver circuit did not include the circuit part 14. In accordance with a broader aspect, however, the driver circuit may also be considered as including the circuit part 14, i. e. as a driver stage device. This driver stage device would have the resistors external to the actual driver circuit, which, for example, would be implemented as an integrated circuit, while the resistors would be provided as arbitrarily realized components on a circuit board. The capacitive load, therefore, represents only an equivalent circuit diagram for the distributed load of the circuit board/ connectors etc.

LIST OF REFERENCE NUMBERS

10 driver stage
12 push/pull-circuit part
12a pMOS-transistor
12b pMOS-transistor
12c nMOS-transistor
12d nMOS-transistor
14 transmission line terminal circuit part
14a terminal resistor
14b terminal resistor
14c termination voltage terminal
14d capacity
16 transcoder
18 transmission line
20 output
30 voltage axis

What is claimed is:

1. A driver stage for driving an output on one of n levels, which are each spaced from each other by a voltage difference of $\Delta V$, comprising:
   a plurality of field effect transistors for driving the output by leading a current to or away from the output;
   a control means for turning the field effect transistors on and off, depending on a plurality of input bit signals in accordance with an allocation rule, which associates a selection of field effect transistors to be turned on and off with each bit combination of bit values of the input bit signals;
   with the relationship of the channel widths of at least two field effect transistors, which both act either for leading current to or away from, being set in dependence on the value of the voltage difference;
   the at least two field effect transistors comprise two field effect transistors of the n-channel or p-channel type, which comprise a threshold voltage $U_{th}$, and, wherein the control means, in a bit combination, is implemented, so as to turn on a first one of the two field effect transistors and to turn the other off, in a different bit combination, to turn both field effect transistors on and, when turning on a respective one of the two field effect transistors, to apply a gate voltage $U_G$ to a source/gate path of the respective one of the two field effect transistors, with the terminal voltage being roughly equal to half of the supply voltage, and the relationship being set in accordance with the following rule:

$$\frac{W_2}{W_1} = 3\frac{V_{DDQ} - \Delta V}{V_{DDQ} - 3\Delta V} \frac{4V_G - 4V_{th} - V_{DDQ} + \Delta V}{4V_G - 4V_{th} - V_{DDQ} + \Delta 3V} - 1$$

with $W_1$ being the transistor width of the first one of the two field effect transistors, $W_2$ being the transistor width of the other of the two field effect transistors, $V_{DDQ}$ being the supply voltage, $\Delta V$ being the voltage difference, $V_{th}$ being the threshold voltage and $V_G$ being the predetermined source/gate voltage.

2. The driver stage in accordance with claim 1, further comprising:
a terminal circuit connected to the output and comprising a means for applying a terminal voltage and a terminal resistor connected in series between the means for applying the terminal voltage and the output.

3. The driver stage in accordance with claim 1, with the plurality of field effect transistors comprising:
a first and a second field effect transistor connected in parallel to each other between the output and a supply voltage, and
a third and fourth field effect transistor being connected in parallel to each other between the output and ground.

4. The driver stage in accordance with claim 1, further comprising:
a control means for turning the field effect transistors on and oft, depending on a plurality of input bit signals in accordance with an allocation rule, which associates a selection of field effect transistors to be turned on and off with each bit combination of bit values of the input bit signals.

5. The driver stage in accordance with claim 1, wherein the at least two field effect transistors are operated in the linear range.

6. The driver stage in accordance with claim 1, wherein the relationship is greater than 2.

* * * * *